United States Patent [19]

Kitanishi

[11] Patent Number: 5,214,495
[45] Date of Patent: May 25, 1993

[54] PHOTOINTERRUPTER AND MANUFACTURING METHOD THEREOF

[75] Inventor: Shigenori Kitanishi, Nara, Japan

[73] Assignee: Sharp Kabushiki Kaisha, Osaka, Japan

[21] Appl. No.: 731,780

[22] Filed: Jul. 18, 1991

[30] Foreign Application Priority Data

Jul. 23, 1990 [JP] Japan .................................. 2-78414

[51] Int. Cl.$^5$ ........................................... H01L 31/12
[52] U.S. Cl. .................................... 257/80; 257/787; 257/431
[58] Field of Search ................. 357/19, 72, 74, 30

[56] References Cited

U.S. PATENT DOCUMENTS

| | | | |
|---|---|---|---|
| 3,597,524 | 8/1971 | Schreiner | 357/74 |
| 4,284,898 | 8/1981 | Felkel et al. | 357/19 |
| 4,307,297 | 12/1981 | Groff et al. | 357/19 |
| 4,633,582 | 1/1987 | Ching et al. | 357/19 |
| 4,694,183 | 9/1987 | Merrick et al. | 357/19 |
| 4,933,729 | 6/1990 | Soejima et al. | 357/190 |
| 5,081,520 | 1/1992 | Yoshii et al. | 357/80 |

FOREIGN PATENT DOCUMENTS

2-24387 5/1990 Japan .
2-24388 5/1990 Japan .

Primary Examiner—Eugene R. LaRoche
Assistant Examiner—Viet Q. Nguyen
Attorney, Agent, or Firm—Nixon & Vanderhye

[57] ABSTRACT

A light emitting element and a light receiving element are mounted on respective lead frames. The light emitting element and one lead frame, and the light receiving element and the other lead frame are covered with respective light transmissive primary moldings. A light shielding secondary molding is formed to unify the primary molding on the light emission side and the primary molding on the light reception side. The respective lead frames extend outward from the respective primary moldings and bent within and extend outward from the secondary molding. A bottom surface of the secondary molding is aligned with respective lower surfaces of the lead frames. A precision in positioning of a photointerrupter with respect to a substrate can be increased.

12 Claims, 9 Drawing Sheets

PHOTOINTERRUPTER AND MANUFACTURING METHOD THEREOF

BACKGROUND OF THE INVENTION

1. Field of the Invention

The present invention relates generally to a photointerrupter and a method of manufacturing such a photointerrupter and, more particularly, to improvements on the structure of a double mold type photointerrupter and on a method of manufacturing such a photointerrupter.

2. Description of the Background Art

Photointerrupters are of two types, a transmission type and a reflection type. The transmission type photointerrupter is structured such that a light emitting element (mostly an infrared emitting diode) and a light receiving element (a phototransistor or photodiode, or alternatively, an element including such a phototransistor or photodiode integrated with a signal amplifier, a waveform shaping circuit or the like) are disposed to be opposite to each other for detecting a light shielding object which passes between the light emitting element and the light receiving element. The reflection type photointerrupter is structured such that the light emitting element and the light receiving element are aligned for detecting the light shielding object by light reflected from the object. Thus, the photointerrupters are employed to detect the existence of the light shielding object without being in contact with the light shielding object. Recently, photointerrupters are widely applicable to audio apparatus, OA apparatus and the like.

Figure 1:
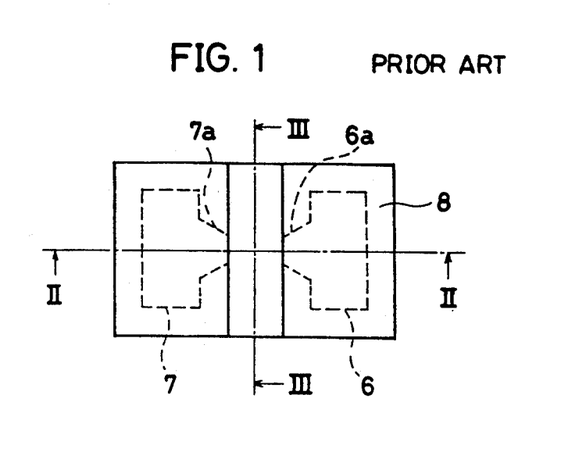
FIG. 1 is a plan view showing a conventional transmission type photointerrupter.
Figure 2:
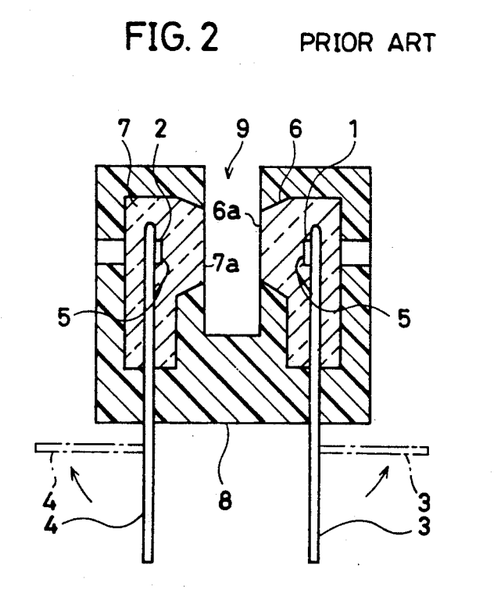
FIG. 2 is a cross-sectional view taken along the line II—II of FIG. 1.
Figure 3:
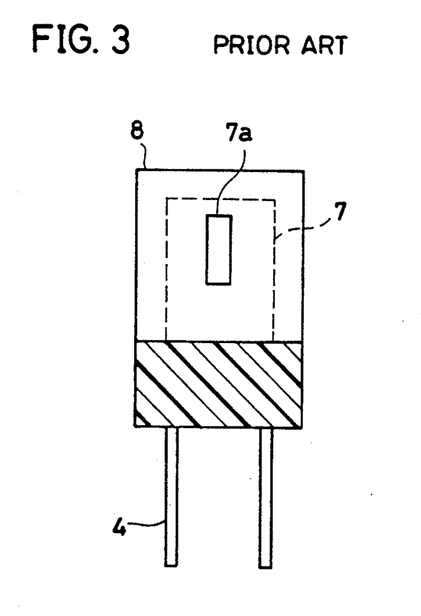
FIG. 3 is a cross-sectional view taken along the line III—III of FIG. 1.
Figure 4:
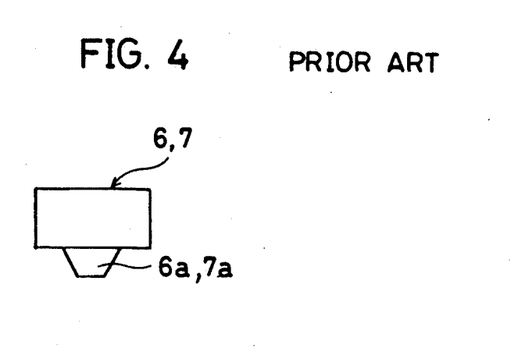
FIG. 4 is a front view showing a primary molding in the conventional transmission type photointerrputer.
Figure 5:
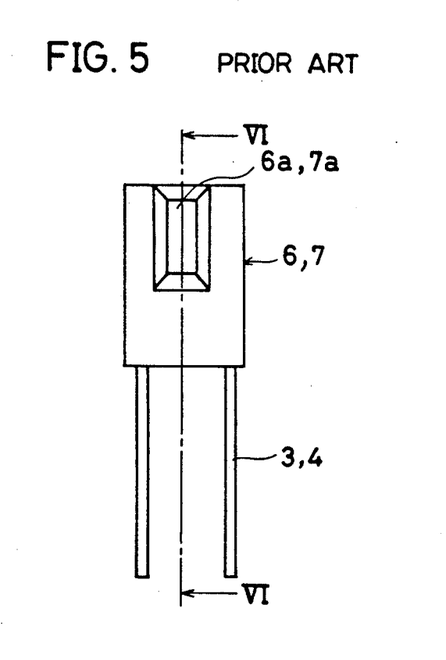
FIG. 5 is a plan view showing the primary molding in the conventional transmission type photointerrupter.
Figure 6:
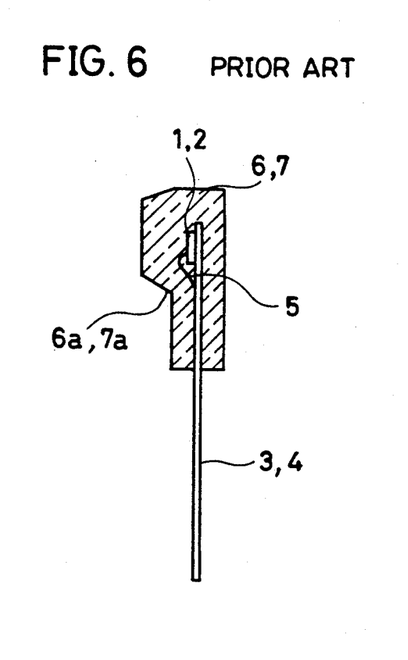
FIG. 6 is a cross-sectional view taken along the line VI—VI of FIG. 5.

FIG. 1 is a plan view showing a conventional transmission type photointerrupter. FIG. 2 is a cross-sectional view taken along the line II—II of FIG. 1. FIG. 3 is a cross-sectional view taken along the line III—III of FIG. 1. Description will now be made on the structure of the conventional photointerrupter with reference to FIGS. 1, 2 and 3. A light emitting element 1 is mounted on one lead frame 3 provided on the light emission side. A bonding wire 5 is provided to connect between light emitting element 1 and the other lead frame 3 provided on the light emission side. A light receiving element 2 is mounted on one lead frame 4 provided on the light reception side. A bonding wire 5 is provided to connect between light receiving element 2 and the other lead frame 4 provided on the light reception side. Primary moldings 6 and 7 are formed of a light transmissive resin to cover light emitting element 1 and lead frames 3, and light receiving element 2 and lead frames 4, respectively. Primary moldings 6 and 7 are shown in FIGS. 4–6. FIG. 4 is a front view of such primary molding. FIG. 5 is a plan view of the primary molding. FIG. 6 is a cross-sectional view taken along the line VI—VI of FIG. 5. Primary moldings 6 and 7 have convexities or protrusions 6a and 7a, respectively. Convexities 6a and 7a are formed to define a portion through which light passes.

Primary molding 6 on the light emission side and primary molding 7 on the light reception side are unified together by a secondary molding 8 formed of a light shielding resin. This causes optical coupling between light emitting element 1 and light receiving element 2, i.e., convexities 6a and 7a are opposed to each other. Primary moldings 6 and 7 are disposed in secondary molding 8 to expose the surface of convexities 6a and 7a. Thus, a passage 9 of an object to be detected is formed.

As denoted by chain-dotted lines in FIG. 2, lead frames 3 and 4 drawn out from a bottom surface of secondary molding 8 are bent toward respective back surfaces of primary moldings 6 and 7. In such a manner, lead frames 3 and 4 are processed to be attached on a predetermined substrate.

Light emitted from light emitting element 1 passes through convexity 6a and then reaches opposite convexity 7a. The light arrived at convexity 7a is detected by light receiving element 2. If any light shielding object is provided along passage 9 formed between convexities 6a and 7a, then the light emitted from light emitting element 1 is intercepted and thus not detected by light receiving element 2. Thus, the transmission type photointerrupter has a sensing function utilizing light.

Figure 7:
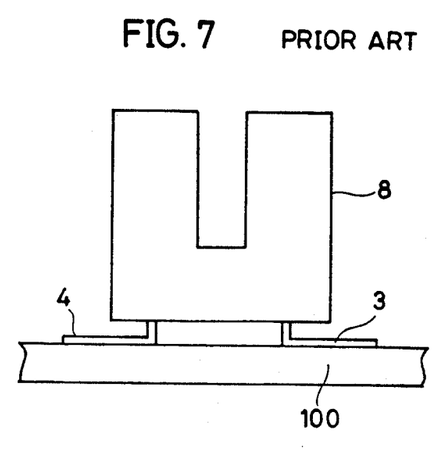
FIG. 7 is a side view showing a conventional photointerrputer attached onto a substrate.
Figure 8:
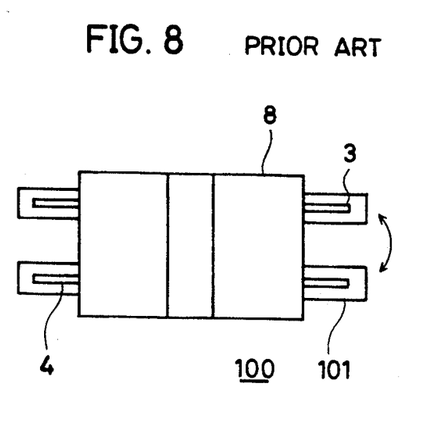
FIG. 8 is a plan view showing the conventional photointerrupter attached onto the substrate.

FIG. 7 is a side view of a conventional transmission type photointerrupter attached on the substrate. FIG. 8 is a plan view of the conventional transmission type photointerrupter attached on the substrate. Lead frames 3 on the light emission side and lead frames 4 on the light reception side, extending outward from a primary molding 8, are attached on a substrate 100. A predetermined conductor pattern 101 is formed on substrate 100. Each of lead frames 3 and 4 is positioned within the range of conductor pattern 101. Each of lead frames 3 and 4 adheres to conductor pattern 101 by a reflow solder.

Figure 9:
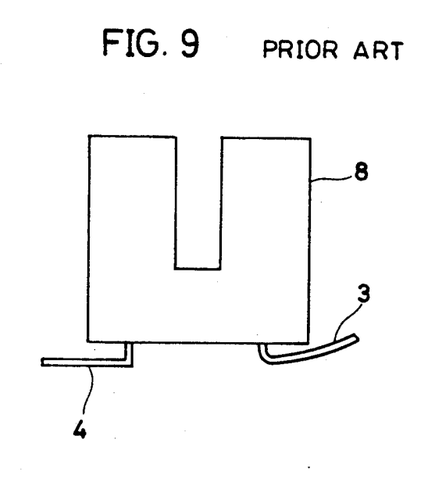
FIGS. 9 and 10 are side views showing a conventional photointerrupter with deformed lead frames.
Figure 10:
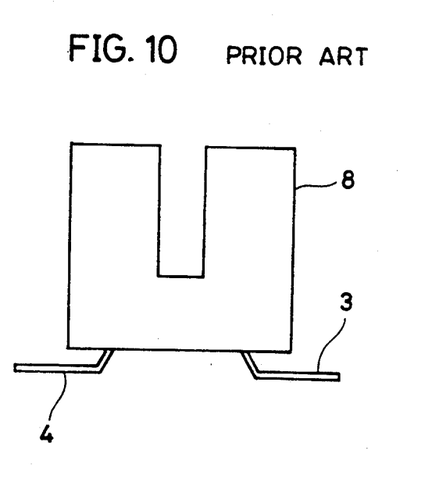

In the conventional photointerrupter, a gap is produced between each of lead frames 3 and 4 and a lower surface of secondary molding 8. When the photointerrupter is automatically mounted on substrate 100, an external force such as pressing or the like for the automatic mounting is applied to the photointerrupter. The application of the external force sometimes causes deformation of lead frames 3 and 4. FIGS. 9 and 10 are side views showing a photointerrupter with deformed lead frames. When only one lead frame 3 is deformed as shown in FIG. 9, uniform soldering cannot be made for adhesion between lead frames 3 and 4 and conductor pattern 101. In addition, the photointerrupter is connected with an inclination to substrate 100. When lead frames 3 and 4 are deformed as shown in FIG. 10, the height of the photointerrputer is compressed. This results in a degradation in detection characteristics, i.e., sensing function of the photointerrupter.

Moreover, since the gap is made between lead frames 3 and 4 and the lower surface of secondary molding 8, the following problem occurs in attachment of the photointerrupter to the substrate. Referring to FIG. 8, the size of conductor pattern 101 formed on substrate 100 is larger than that of each of lead frames 3 and 4. Each lead frame 3, 4 adheres to conductor pattern 101 by a reflow solder. In that case, with the reflow solder melting, the photointerrupter, i.e., secondary molding 8 is sometimes displaced in a direction of rotation shown by the arrow of FIG. 8 due to surface tension or the like of the solder.

Figure 11A:
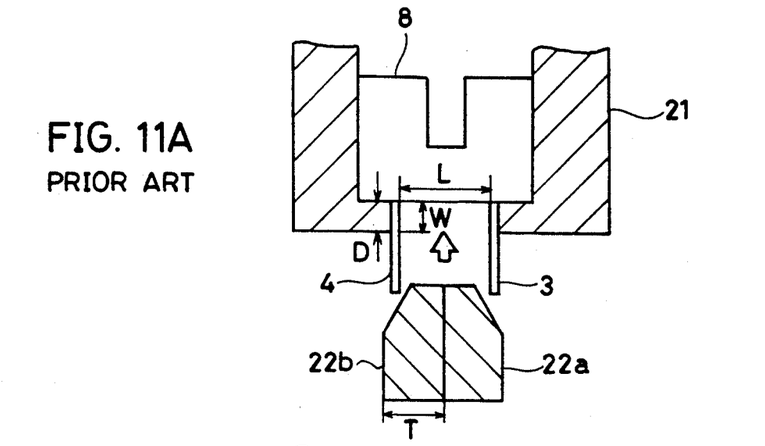
FIGS. 11A, 11B and 11C are cross-sectional views of a metal mold illustrated in accordance with a lead frame bending process in the conventional photointerrupter.
Figure 11B:
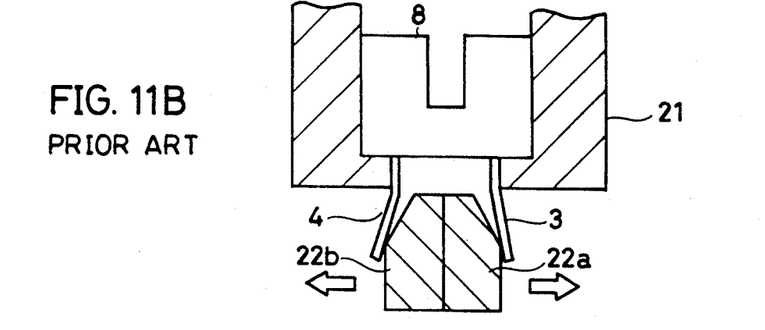
Figure 11C:
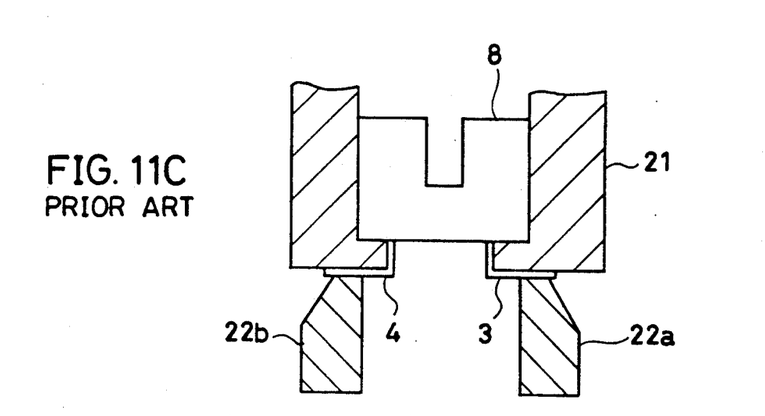
Figure 12:
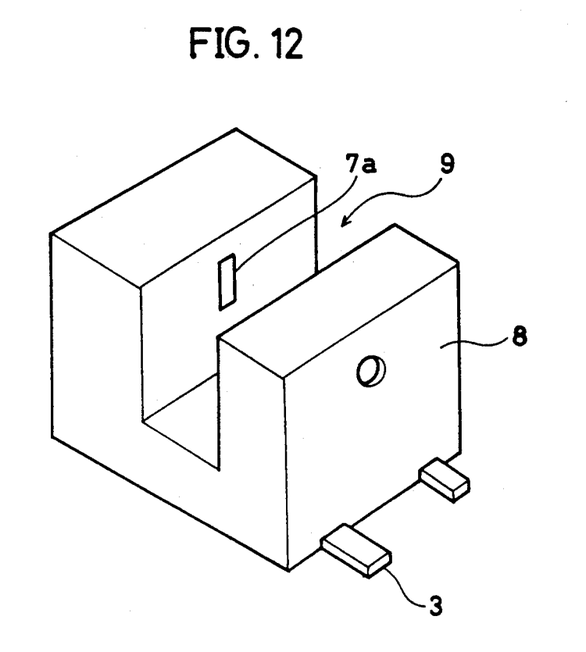
FIG. 12 is a perspective view showing a transmission type photointerrupter according to one embodiment of the present invention.
Figure 13:
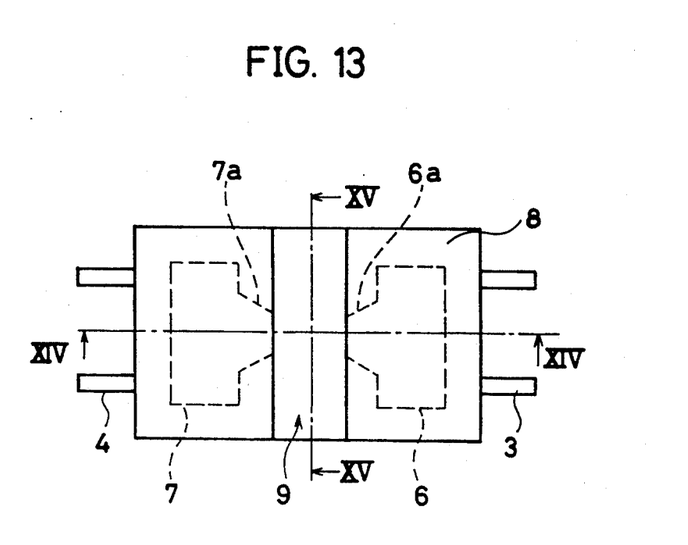
FIG. 13 is a plan view showing the transmission type photointerrupter according to the one embodiment of the present invention.

FIGS. 11A—11C are cross-sectional views of a metal mold illustrated in accordance with a lead frame bending process in the conventional photointerrupter. With reference to FIG. 11A, each of lead frames 3 and 4 extends from the lower surface of secondary molding 8. Punches 22a and 22b are inserted between lead frames 3 and 4 as shown by the arrow. A metal mold 21 is in close contact with an outer side surface of secondary molding 8 and a proximal end of each lead frame 3, 4.

Referring to FIG. 11B, a spacing between lead frames 3 and 4 is expanded by punches 22a and 22b. Then, punches 22a and 22b move in opposite directions as shown by the arrows.

Thus, lead frames 3 and 4 are bent as shown in FIG. 11C.

In the above-described lead frame bending process, it is necessary to reduce a thickness D of a convex portion of metal mold 21 for receiving punches 22a and 22b in order to reduce a dimension W of the proximal end of each lead frame 3, 4 as shown in FIG. 11A. However, there is a limitation in reducing thickness D with respect to the strength of the forming metal mold.

In addition, if a spacing L between lead frames 3 and 4 decreases in the above lead frame bending process, a thickness T of each of punches 22a and 22b must be reduced. However, there is a limitation in reducing thickness T with respect to the strength of the punches.

SUMMARY OF THE INVENTION

One object of the present invention is to precisely attach a photointerrupter onto a surface of a substrate.

Another object of the present invention is to bend lead frames so as to align a lower surface of a secondary molding with surfaces of the lead frames.

A further object of the present invention is to facilitate positioning of a photointerrupter in attachment of the photointerrupter to a substrate.

A still further object of the present invention is to facilitate a lead frame bending process even when the spacing between lead frames is small.

A photointerrupter according to one aspect of the present invention includes a light emitting element, a first lead frame, a first light transmissive molding, a light receiving element, a second lead frame, a second light transmissive molding, and a light shielding molding. The light emitting element is mounted on the first lead frame. The first light transmissive molding is formed of a light transmissive resin to cover the light emitting element and the first lead frame and includes a light passing portion. The light receiving element is mounted on the second lead frame. The second light transmissive molding is formed of a light transmissive resin to cover the light receiving element and the second lead frame and includes a light passing portion. The light shielding molding is formed of a light shielding resin so as to optically couple the light emitting element and the light receiving element and to unify the first light transmissive molding and the second light transmissive molding together. The respective first and second lead frames extending outward from the respective first and second light transmissive moldings are bent within the light shielding molding and extend outward from the light shielding molding.

In accordance with a method of manufacturing a photointerrupter according to another aspect of the present invention, a first light transmissive molding is formed of a light transmissive resin so as to cover a first lead frame on which a light emitting element is mounted. A second light transmissive molding is formed of a light transmissive resin so as to cover a second lead frame on which a light receiving element is mounted. This causes the respective first and second lead frames to extend outward from the respective first and second light transmissive moldings. The first and second lead frames are bent outward from the first and second light transmissive moldings, respectively. A light shielding molding is formed of a light shielding resin, with the first and second lead frames being bent, so as to optically couple the light emitting element and the light receiving element and combine the first and second light transmissive moldings together.

According to a preferred embodiment of the present invention, the first and second lead frames are bent within the light shielding molding so that the respective lead frames may have respective approximately parallel surfaces outward from the light shielding molding. The respective approximately parallel surfaces of the first and second lead frames are aligned with an external surface of the light shielding molding. The light shielding molding is formed to expose the respective light passing portions of the first and second light transmissive moldings. The respective light passing portions are disposed to oppose to each other or be directed in the same direction. The first lead frame is bent toward one surface of the lead frame opposite to the other surface thereof having the light emitting element mounted thereon. Similarly, the second lead frame is bent toward one surface of the lead frame opposite to the other surface thereof having the light receiving element mounted thereon.

According to a preferred embodiment of a method of manufacturing a photointerrupter of the present invention, in the step of forming a light shielding molding, first and second lead frames are positioned on a parting line of a metal mold. First and second light transmissive moldings are secured in the space of the forming metal mold. A light shielding resin is injected into that space.

In the photointerrupter of the present invention, the respective lead frames are bent in the light shielding molding as a secondary molding. Thus, the lead frames can be bent so that the surface of each lead frame may be aligned with the external surface of the light shielding molding. Accordingly, when the photointerrupter is attached to a substrate, i.e., each lead frame adheres onto the substrate, the photointerrupter is not inclined to the substrate, or the dimension of the photointerrupter in the direction of its height does not vary. Since the surface of each lead frame can be aligned with the external surface of the light shielding molding, a positioning of each lead frame with respect to the substrate can be made by applying an adhesive onto the lower surface of the light shielding molding and fixing the light shielding molding onto the substrate. This can improve precision in the positioning of the lead frames.

Further, according to the manufacturing method of the present invention, the first and second lead frames are already bent before the formation of the light shielding molding. This makes it possible to decrease the spacing between the lead frames without restrictions placed by the strength of the metal molds for a lead frame bending process. In addition, since the light shielding molding is formed with the first and second lead frames already bent in advance, the respective surfaces of the first and second lead frames can be aligned in the same level as the external surface of the light shielding molding.

As has been mentioned above, according to the present invention, the photointerrupter can be attached in high precision onto the substrate, and the lead frames can easily be bent even if the spacing between the lead frames is small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

With reference to FIGS. 12-15, a transmission type photointerrupter according to one embodiment of the present invention includes a light emitting element 1, lead frames 3 provided on the light emission side, a primary molding 6 provided on the light emission side, a light receiving element 2, lead frames 4 provided on the light reception side, a primary molding 7 provided on the light reception side, and a secondary molding 8. Light emitting element 1 is mounted on one lead frame 3. Light receiving element 2 is mounted on one lead frame 4. Light emitting element 1 and light receiving element 2 are each connected to the other lead frames 3 and 4 through a bonding wire 5 such as a gold wire or the like. Primary molding 6 is formed of a light transmissive resin to cover light emitting element 1 and lead frames 3. Primary molding 7 is formed of a light transmissive resin to cover light receiving element 2 and lead frames 4. Secondary molding 8 is formed of a light shielding resin so that a surface of a convexity 6a of primary molding 6 and a surface of a convexity 7a of primary molding 7 may be exposed and oppose to each other. Secondary molding 8 unifies primary moldings 6 and 7 together. In such a manner, primary moldings 6 and 7 are opposed to each other interposing a passage 9 of an object to be detected therebetween. That is, light emitting element 1 and light receiving element 2 are disposed to be optically coupled with each other.

Figure 16:
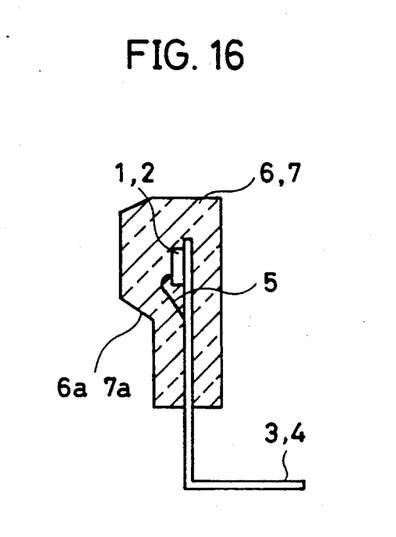
FIG. 16 is a cross-sectional view showing a primary molding in the transmission type photointerrupter of the present invention.

As shown in FIG. 16, primary moldings 6 and 7 are formed of a resin transmitting infrared rays therethrough, or a thermoplastic resin which has a light transmitting property and to which a dye intercepting a visible ray is added, by employing a transfer molding method or a casting molding method. Convexities 6a and 7a are formed in the form of squares so as to restrict portions through which light passes. Lead frames 3 and 4 are bent in the form of a letter "L" toward respective back surfaces of primary moldings 6 and 7 after formation of primary moldings 6 and 7, as shown in FIG. 16.

Figure 14:
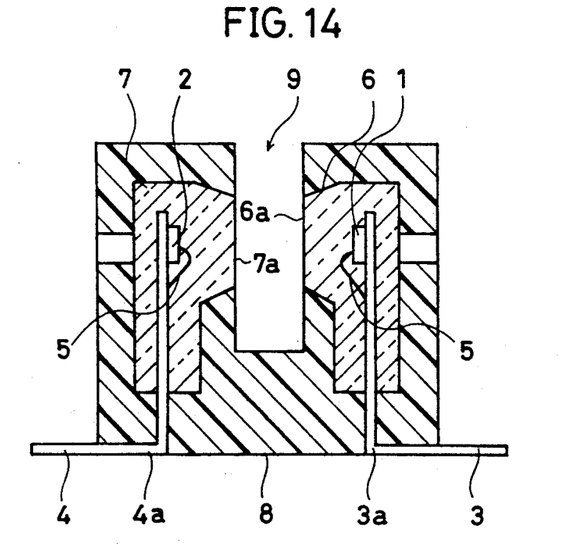
FIG. 14 is a cross-sectional view taken along the line XIV—XIV of FIG. 13.
Figure 15:
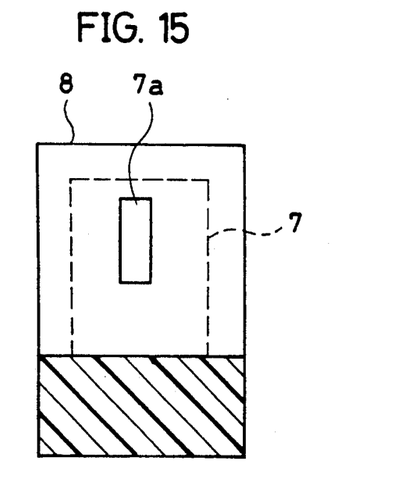
FIG. 15 is a cross-sectional view taken along the line XV—XV of FIG. 13.
Figure 17:
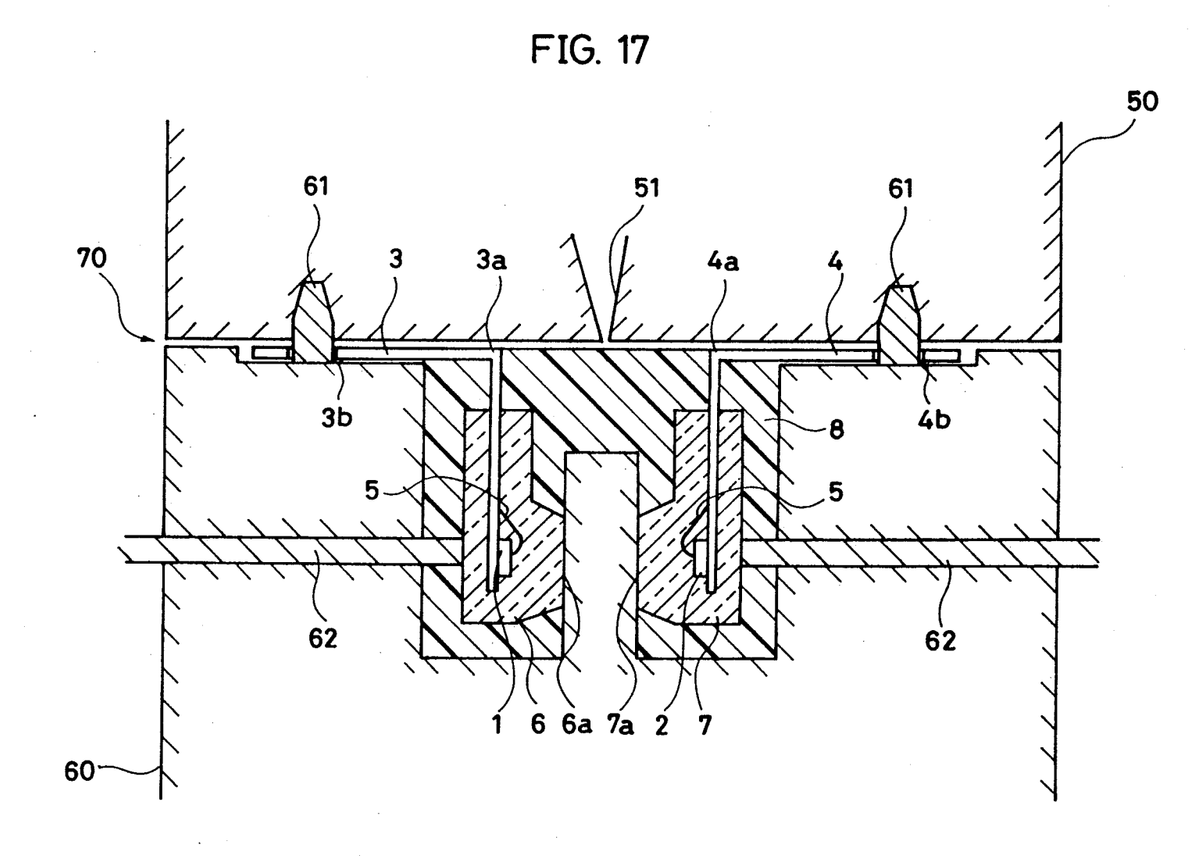
FIG. 17 is a cross-sectional view of a forming metal mold in a secondary molding step of the transmission type photointerrupter of the present invention.

Description will now be made on the step of forming secondary molding 8 with reference to FIG. 17. Respective primary moldings 6 and 7 having respective lead frames 3 and 4 bent in the shape of "L" are positioned in a lower metal mold 60. This positioning is made by inserting pilot pins 61 and 61 of lower metal mold 60 into holes 3b and 4b of lead frames 3 and 4, respectively. An upper metal mold 50 is thereafter placed on lower metal mold 60. Knock pins 62 and 62 of lower metal mold 60 are extruded from the respective back surfaces of primary moldings 6 and 7. This causes primary moldings 6 and 7 to be secured within lower metal mold 60. Then, a thermoplastic resin having a light shielding property is injected through a gate 51 provided on upper metal mold 50. Thus, secondary molding 8 is formed to unify both primary moldings 6 and 7 together. At that time, each of lead frames 3 and 4 is set to be located on a parting line 70 between upper metal mold 50 and lower metal mold 60. Accordingly, respective bends 3a and 4a of lead frames 3 and 4 are exposed from a bottom surface of secondary molding 8, as shown in FIG. 14 or 17. In such a manner, the bottom surface of secondary molding 8 is aligned with the respective surfaces of lead frames 3 and 4.

Figure 18:
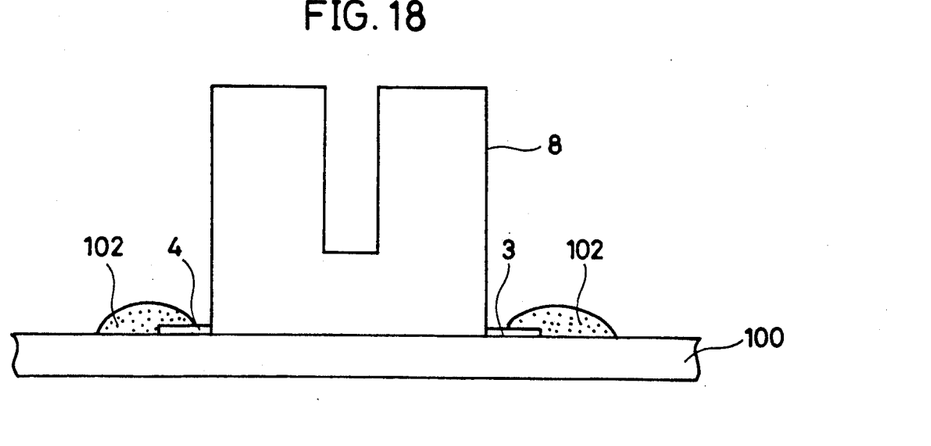
FIG. 18 is a side view showing one embodiment (a surface mount type) of the transmission type photointerrupter of the present invention, attached onto the substrate.

In the transmission type photointerrupter of the present invention, since a lower surface of secondary molding 8 is aligned with the respective surfaces of lead frames 3 and 4, an inclination or a variation in the dimension of the direction of height is hardly produced when the photointerrupter is attached to a surface of a substrate 100 as shown in FIG. 18. In addition, when lead frames 3 and 4 adhere to the surface of substrate 100 by a reflow solder 102, the adhesion of lead frames 3 and 4 by reflow solder 102 can be made by applying an adhesive onto the lower surface of secondary molding 8 and fixing secondary molding 8 on substrate 100.

This prevents the photointerrupter from being affected by a surface tension or the like which is produced when reflow solder 102 melts, and also prevents the position of the photointerrupter from being displaced on substrate 100. That is, when the photointerrupter is attached to substrate 100, the positioning of the photointerrupter with respect to substrate 100 is ensured by employing the adhesive.

In a manufacturing method of the present invention, since the bending process of the lead frames is carried out before the formation of the secondary molding as described above, the respective surfaces of the lead frames can be aligned with the bottom surface of the secondary molding, and the spacing between the lead frames can also be made smaller.

Figure 19:
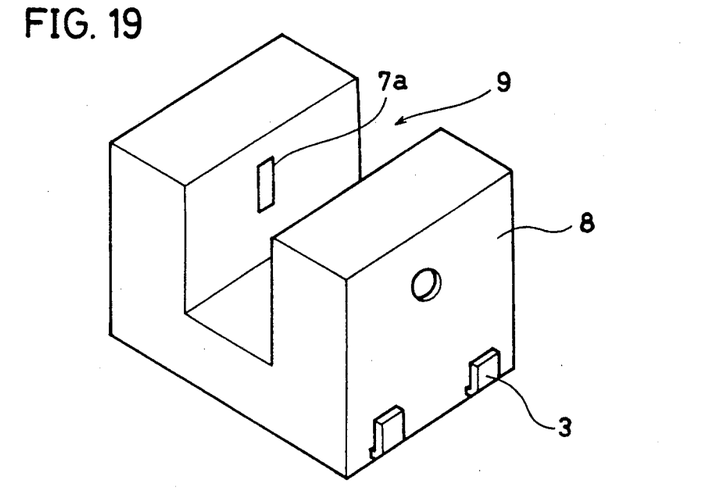
FIG. 19 is a perspective view showing a transmission type photointerrupter according to another embodiment of the present invention.
Figure 20:
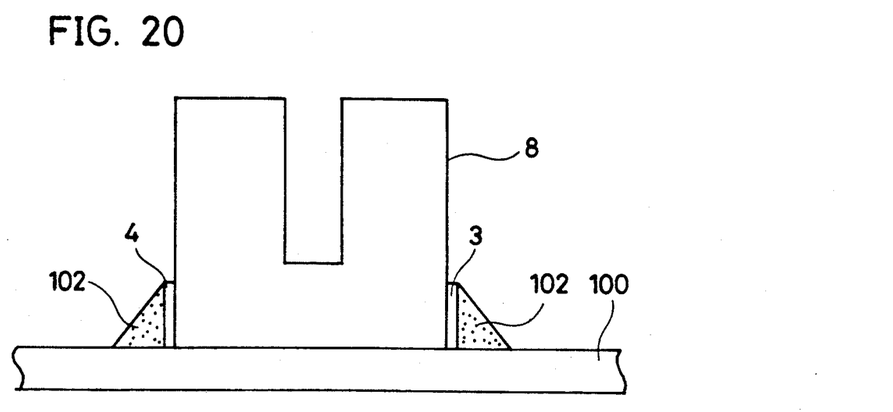
FIG. 20 is a side view showing the above another embodiment (a vertical plane mount type) of a transmission type photointerrupter of the present invention, attached onto a substrate.

The present invention is also applicable to a photointerrupter of a vertical plane mount type shown in FIG. 19. As shown in FIG. 19, lead frames 3 exposed and extending from a secondary molding 8 is bent along a back surface of secondary molding 8. Such a vertical plane mount type photointerrupter is attached onto a substrate 100 by a reflow solder 102 as shown in FIG. 20.

Figure 21:
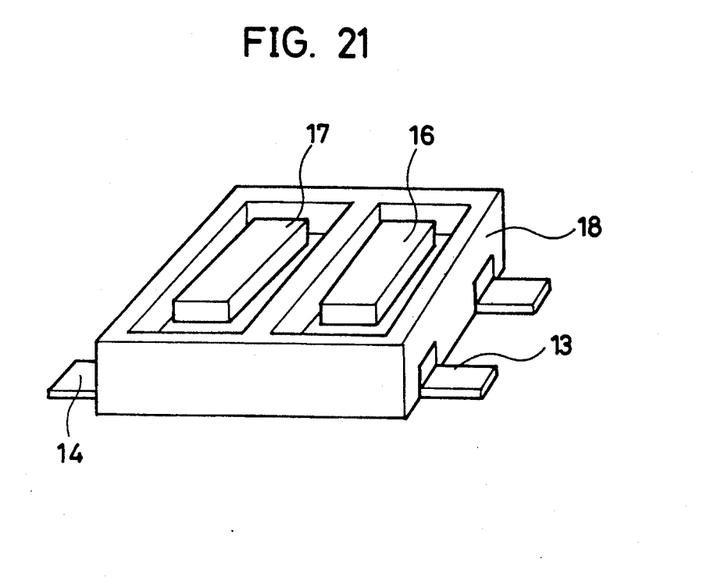
FIG. 21 is a perspective view showing a reflection type photointerrupter according to still another embodiment of the present invention.
Figure 22:
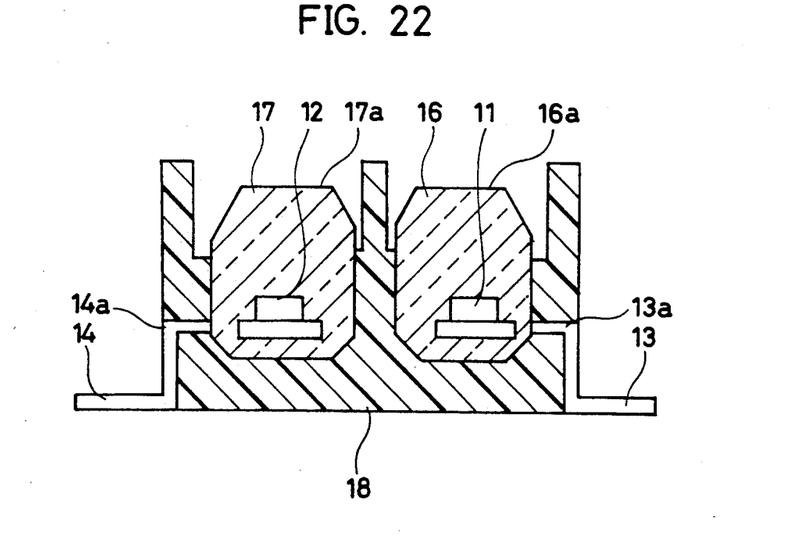
FIG. 22 is a cross-sectional view showing the reflection type photointerrupter according to the above still another embodiment of the present invention.

While the description has been made on the case where the present invention is applied to the transmission type photointerrupter in the foregoing embodiment, the present invention is also applicable to a reflection type photointerrupter. With reference to FIGS. 21 and 22, a primary molding 16 on the light emission side and a primary molding 17 on the light reception side are arranged in parallel so that convexities 16a and 17a formed as light passing portions may be directed in the same direction. Primary moldings 16 and 17 are unified together by a secondary molding 18 to be optically coupled with each other. Respective lead frames 13 and 14 are bent to be exposed from secondary molding 18. Bends 13a and 14a of respective lead frames 13 and 14 are exposed at opposite side surfaces of secondary molding 18. Lead frames 13 and 14 are bent so that the opposite side surfaces of secondary molding 18 may be aligned with the respective surfaces of lead frames 13 and 14. Further, lead frames 13 and 14 are bent so that a bottom surface of secondary molding 18 may be aligned with respective lower surfaces of lead frames 13 and 14. In this manner, the reflection type photointerrupter is structured so as to be able to be attached onto the surface of the substrate.

As has been mentioned above, according to the present invention, when the photointerrupter is attached onto the substrate, precision in positioning of the photointerrupter can be increased, and the lead frames can easily be bent so that the photointerrupter can be attached onto the surface of the substrate even when the spacing between the lead frames is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photointerrupter, comprising:
   a light emitting element;
   a first lead frame on which said light emitting element is mounted;
   a first light transmissive molding formed of a light transmissive resin to cover said light emitting element and said first lead frame and having a light passage portion;
   a light receiving element;
   a second lead frame on which said light receiving element is mounted;
   a second light transmissive molding formed of a light transmissive resin to cover said light receiving element and said second lead frame and having a light passage portion; and
   a light shielding molding formed of a light shielding resin for optically coupling said light emitting element and said light receiving element and unifying said first light transmissive molding and said second light transmissive molding together,
   said first lead frame and said second lead frame extending outward from said first light transmissive molding and said second light transmissive molding, respectively, wherein said first and second lead frames are bent in opposing directions and before formation of said light shielding molding to contact and be aligned with an external surface of said light shielding molding.

2. The photointerrupter according to claim 1, wherein
   said first lead frame and said second lead frame extend in a single direction within said first and second light transmissive moldings.

3. The photointerrupter according to claim 1, wherein
   said first lead frame and said second lead frame are bent so that respective lead frame surfaces are approximately parallel with each other and extend outward from said light shielding molding.

4. The photointerrupter according to claim 3, wherein
   the respective approximately parallel surfaces of said first and second lead frames are aligned with an outer surface of said light shielding molding.

5. The photointerrupter according to claim 4, further comprising:
   a substrate on which the respective approximately parallel surfaces of said first and second lead frames are fixed.

6. The photointerrupter according to claim 1, wherein
   said light shielding molding is formed so as to expose the light passage portion of said first light transmissive molding and the light passage portion of said second light transmissive molding.

7. The photointerrupter according to claim 6, wherein
   the respective light passage portions of said first and second light transmissive moldings are opposed to each other.

8. The photointerrupter according to claim 6, wherein
   the respective light passage portions of said first and second light transmissive moldings are directed in the same direction.

9. The photointerrupter according to claim 1, wherein
   said first lead frame is bent toward one surface of said first lead frame opposite to the other surface thereof having said light receiving element mounted thereon; and
   said second lead frame is bent toward one surface of said second lead frame opposite to the other surface thereof having said light receiving element mounted thereon.

10. A photointerrupter according to claim 1 wherein said external surface of said light shielding molding is a bottom surface for contacting a substrate.

11. A photointerrupter according to claim 1 wherein a portion of said first and second lead frames is further bent to be aligned and in contact with a respective side surface of said light shielding molding.

12. A photointerrupter according to claim 1 wherein said surface of said light shielding molding is a bottom surface and a portion of said bottom surface is coated with adhesive such that the photointerrupter may be precisely aligned on a substrate.

* * * * *